(12) United States Patent
Kuo et al.

(10) Patent No.: US 11,398,396 B2
(45) Date of Patent: Jul. 26, 2022

(54) APPARATUS AND METHODS FOR HANDLING DIE CARRIERS

(71) Applicant: Taiwan Semiconductor Manufacturing Co., Ltd., Hsinchu (TW)

(72) Inventors: Tsung-Sheng Kuo, Hsin-Chu (TW); Kai-Chieh Huang, Hsin-Chu (TW); Wei-Ting Hsiao, Taichung (TW); Yang-Ann Chu, Hsin-Chu (TW); I-Lun Yang, Hsin-Chu (TW); Hsuan Lee, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 86 days.

(21) Appl. No.: 16/526,892

(22) Filed: Jul. 30, 2019

(65) Prior Publication Data

US 2020/0058534 A1 Feb. 20, 2020

Related U.S. Application Data

(60) Provisional application No. 62/718,848, filed on Aug. 14, 2018.

(51) Int. Cl.
| | |
|---|---|
| *H01L 21/67* | (2006.01) |
| *H01L 21/677* | (2006.01) |
| *B65G 47/90* | (2006.01) |
| *H01L 21/673* | (2006.01) |

(52) U.S. Cl.
CPC ........ *H01L 21/67745* (2013.01); *B65G 47/90* (2013.01); *H01L 21/67294* (2013.01); *H01L 21/67333* (2013.01)

(58) Field of Classification Search
None
See application file for complete search history.

(56) References Cited

U.S. PATENT DOCUMENTS

| | | | | |
|---|---|---|---|---|
| 5,909,994 | A * | 6/1999 | Blum | H01L 21/67201 414/217 |
| 8,529,185 | B2 * | 9/2013 | Hirasawa | G01R 31/2893 414/749.6 |
| 2008/0289715 | A1 * | 11/2008 | Nakashima | H01L 21/6715 138/106 |
| 2009/0087287 | A1 * | 4/2009 | Yu | H01L 21/67772 414/217.1 |
| 2018/0047149 | A1 * | 2/2018 | Trumbauer | G06T 7/0004 |
| 2019/0035696 | A1 * | 1/2019 | Lin | H05K 13/08 |

* cited by examiner

*Primary Examiner* — Ronald P Jarrett
(74) *Attorney, Agent, or Firm* — Duane Morris LLP

(57) ABSTRACT

Apparatus and methods for handling die carriers are disclosed. In one example, a disclosed apparatus includes: a load port configured to load a die carrier operable to hold a plurality of dies into a processing tool; and a lane changer coupled to the load port and configured to move at least one die in the die carrier to an input of the processing tool and transfer the at least one die into the processing tool for processing the at least one die.

20 Claims, 14 Drawing Sheets

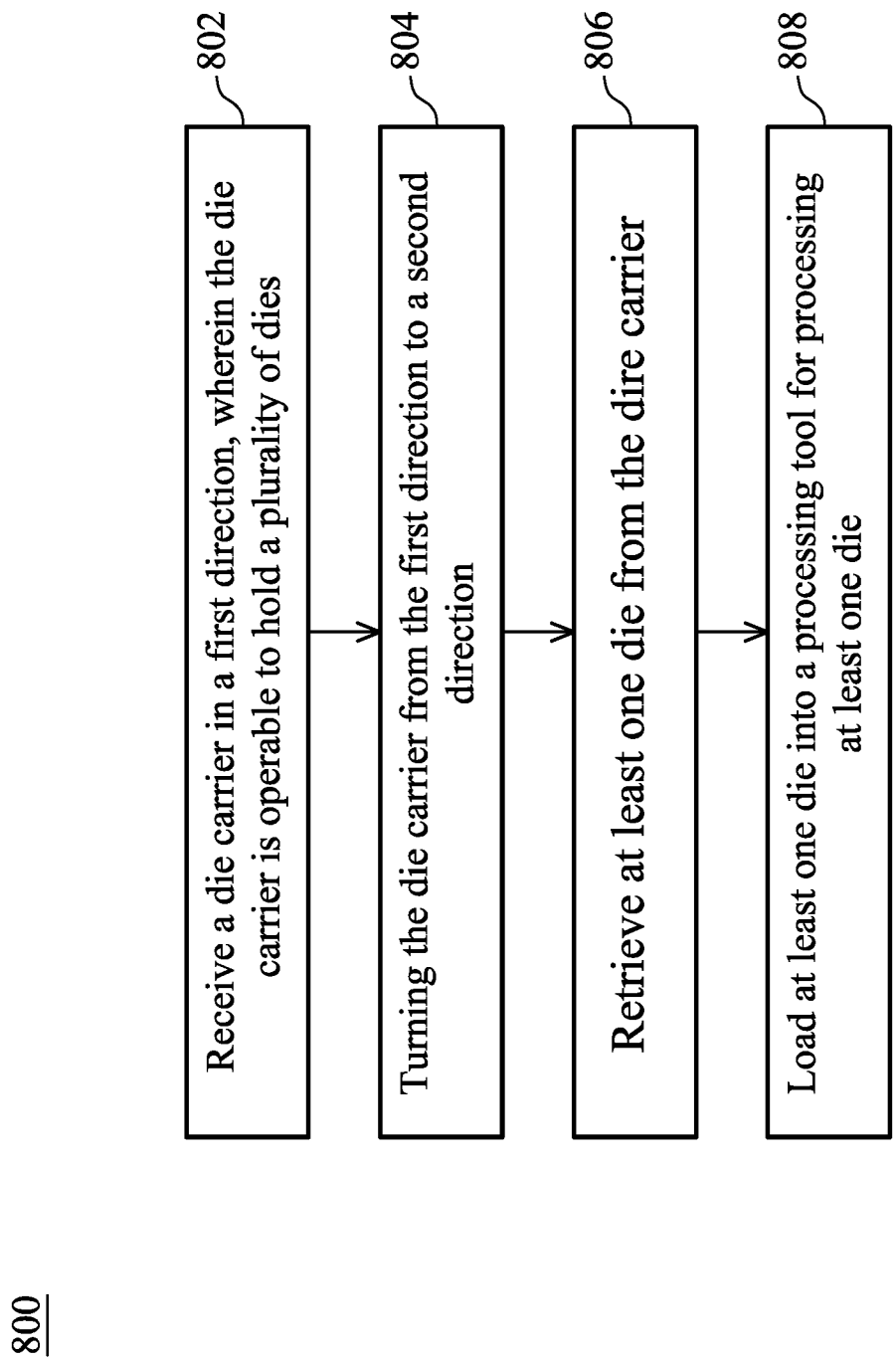

APPARATUS AND METHODS FOR HANDLING DIE CARRIERS

CROSS-REFERENCE TO RELATED APPLICATION

The present application claims priority to U.S. Provisional Patent Application No. 62/718,848, filed on Aug. 14, 2018, which is incorporated by reference herein in its entirety.

BACKGROUND

During manufacturing of a semiconductor device, the device is usually processed at many work stations or processing machines. For example, integrated circuits are produced in large batches on a single wafer, which can be cut into many pieces each of which contains one copy of the circuit and is called a die. Multiple dies can be carried on a plate called boat, while multiple boats can be carried in a carrier called magazine before and after the dies are processed at a processing tool.

The transporting or conveying of a die carrier, e.g. a magazine, is an important aspect in the total manufacturing process. While an automated material handling system (AMHS) may be used to automatically handle and transport magazines between various processing machines ("tools"), human operation is conventionally required to load a magazine into a processing tool and unload a magazine from a processing tool.

To save human resource, a load port may be used to load and unload different types of dies to be processed, e.g. at a bumping die level. Existing design of load port can only support one magazine at a time, and cannot support different processing tools having different numbers and locations of flowing channels, which causes a bottle neck of work efficiency in a semiconductor fabrication facility ("FAB"). As such, existing apparatus and methods for handling die carriers are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

FIG. 8 is a flow chart illustrating an exemplary method for handling die carriers, in accordance with some embodiments of the present disclosure.

DETAILED DESCRIPTION

Figure 1:
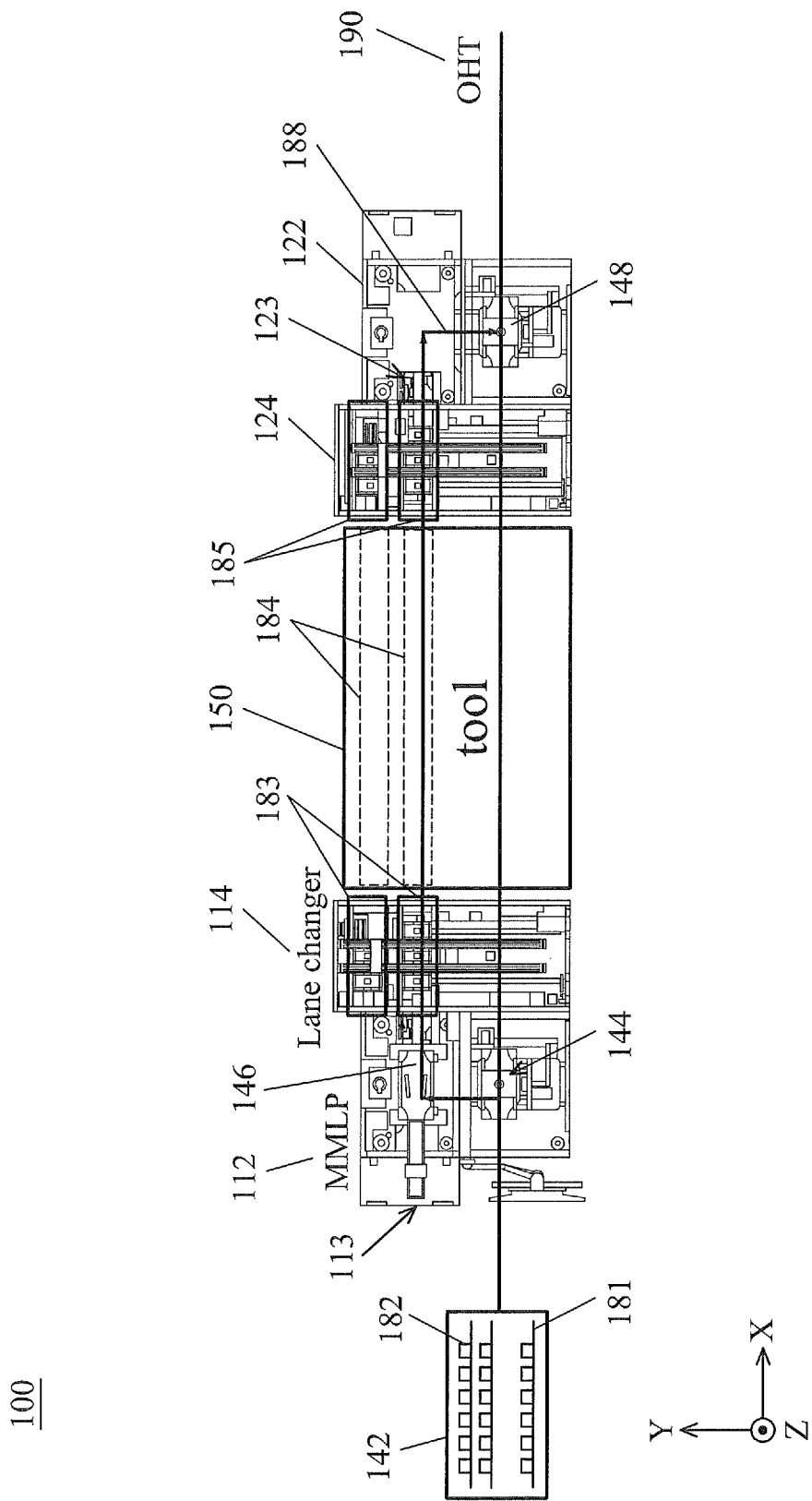
FIG. 1 illustrates an exemplary die processing system, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

An integrated circuit (IC) manufacturing may go through a plurality of production steps, during which carriers are used to support and carry the manufactured wafers and dies. The carriers for carrying device dies may include boats, trays, glass carriers, magazines, etc. In one embodiment, multiple dies can be carried on a boat, while multiple boats can be carried in a magazine before and after the dies are processed at a processing tool. To save human resource, a load port may be used to load and unload die carriers during the IC manufacturing.

To further improve work efficiency and production quality in a semiconductor fabrication facility ("FAB"), the present teaching discloses apparatus and methods for automatically load and unload a die carrier, e.g. a magazine holding multiple boats, with a multi-magazine storage and a multi-lane changer for transferring each boat to a corresponding lane aligned with a flowing channel of a processing tool for processing the dies in the boat.

In some embodiments, a disclosed apparatus includes a load port and a lane changer coupled to the load port. The load port can load, into a processing tool, a magazine holding multiple boats each including multiple dies for processing. The lane changer has a conveyor and a plurality of lanes. In one embodiment, the load port comprises a push bar operable to push a boat including at least one die from the magazine to the conveyor. The conveyor may move the boat along at least one direction to one of the plurality of lanes to align the boat with an input of the processing tool and convey the boat into the processing tool for processing the at least one die. The load port may comprise a storage space configured to store a plurality of die carriers at a same time. In one embodiment, when a table of the load port receives a die carrier, e.g. from a transport tool like OHT, the die carrier is placed in a first direction on a turn stage on the table. The turn stage is operable to turn the die carrier from the first direction to a second direction for retrieving a boat from the die carrier and/or storing the die carrier.

In one embodiment, the same load port further comprises an additional push bar to push the boat from the conveyor into the die carrier, and is further configured to unload the die carrier after the at least one die is processed. In another embodiment, the disclosed apparatus includes a second load port configured to unload the die carrier after the at least one die is processed, and a second lane changer coupled to the second load port and configured to transfer the at least one die from an output of the processing tool into the die carrier with a second push bar associated with the second load port.

The present disclosure is applicable to all kinds of devices that load or unload die carriers. The disclosed apparatus can automatically move a boat to a corresponding lane to align the boat with an input, e.g. a flowing channel, of a processing tool, to support different types of processing tools and/or a processing tool including multiple flowing channels. This improves work efficiency, saves human operation resources and improves production quality by reducing human errors on the manufacturing floor.

FIG. 1 illustrates a top view of an exemplary die processing system 100, in accordance with some embodiments of the present disclosure. As shown in FIG. 1, the die processing system 100 includes a first load port 112, a first lane changer 114, a processing tool 150, a second lane changer 124, a second load port 122, and a transport tool 190.

The transport tool 190 in this example may be an overhead hoist transport (OHT) that can transport a die carrier 142, e.g. a magazine holding several boats 181 each including at least one die 182, between different processing tools during the IC manufacturing. The first load port 112 in this example receives the die carrier 142 from the transport tool 190 and loads the die carrier 142 for the processing tool 150 to process at least one die in the die carrier 142. Accordingly, the second load port 122 in this example unloads the die carrier 142 from the processing tool 150 after the at least one die is processed.

The first lane changer 114 in this example is coupled to the first load port 112 and includes a plurality of lanes 183. The first load port 112 may include a push bar 113 that is operable to push a boat from the received die carrier to a conveyor in the first lane changer 114. The conveyor may move the boat along the Y direction and/or the Z direction to align the boat with an input of the processing tool 150. For example, when the processing tool 150 has a plurality of flowing channels 184, the conveyor of the first lane changer 114 may move each boat to a corresponding lane aligned with one of the plurality of flowing channels 184, and convey the boat into the flowing channel of the processing tool 150 along the X direction to perform a corresponding processing on the dies in the boat.

As shown in FIG. 1, the transport tool 190 moves the die carrier 142 along the X direction, while the die carrier 142 is placed along the Y direction when the die carrier 142 is transported to the first load port 112. That is, when the die carrier 142 is first placed onto a table of the first load port 112 in this example, the die carrier 142 extends along the Y direction. To properly push a boat from the received die carrier to the conveyor in the first lane changer 114, the die carrier 142 is turned by a turn stage on the table of the first load port 112. This turned die carrier 144 extends along the X direction. A door of the turned die carrier 144 may be opened automatically, e.g. by an opening mechanism coupled to the first load port 112. The opened die carrier 146 includes boats to be pushed by the push bar 113 into the first lane changer 114, while the opened die carrier 146 extends along the X direction.

In one embodiment, the die carrier direction of the transport tool 190 is the same as the desired direction of the push bar 113, which means the die carrier 142 landed on the table of the first load port 112 will not be turned before the boat in the die carrier 142 is pushed into the first lane changer 114. In another embodiment, the die carrier direction of the transport tool 190 and the desired direction of the push bar 113 are not perpendicular to each other as shown in FIG. 1, but form a certain angle (e.g. between 0° and 180°), which means the die carrier 142 landed on the table of the first load port 112 will be turned according to the certain angle before the boat in the die carrier 142 is pushed into the first lane changer 114.

The second lane changer 124 in this example is coupled to the second load port 122 and includes a plurality of lanes 185. The second lane changer 124 may include a conveyor that can move to a corresponding output of the processing tool 150 to receive a processed die boat. For example, when the processing tool 150 has a plurality of flowing channels 184, the conveyor of the second lane changer 124 may move to a corresponding lane aligned with one of the plurality of flowing channels 184 that outputs the processed boat, and move the processed boat along the Y direction and/or the Z direction to a lane aligned with a second push bar 123.

The second push bar 123 in this example is operable to push a processed boat from the conveyor in the second lane changer 124 to a die carrier stored at the second load port 122, along the X direction. The die carrier receiving the processed boat may have a same type as that of the die carrier 142. In this example, the second load port 122 includes a closing mechanism that can automatically close a door onto the die carrier stored at the second load port 122 to form a closed die carrier 148. While the closed die carrier 148 extends along the X direction, a turn stage on the table of the second load port 122 may turn the closed die carrier 148 to make the closed die carrier 148 extend along the Y direction as the die carrier 142. As such, the transport tool 190 can pick up the turned die carrier from the table of the second load port 122 and transport it to next processing tool for processing.

In one embodiment, the die carrier direction of the transport tool 190 is the same as the desired direction of the second push bar 123, which means the closed die carrier 148 landed on the table of the second load port 122 will not be turned before the closed die carrier 148 is picked up by the transport tool 190. In another embodiment, the die carrier direction of the transport tool 190 and the desired direction of the second push bar 123 are not perpendicular to each other as shown in FIG. 1, but form a certain angle, which means the closed die carrier 148 landed on the table of the second load port 122 will be turned according to the certain angle before the closed die carrier 148 is picked up by the transport tool 190.

The processing tool 150 in this example performs one or more processing on the dies in each loaded boat, e.g. at the bumping die level, and outputs the processed boat via an output. In this example, the input and the output of the processing tool 150 are located on different sides of the processing tool 150. Accordingly, two load ports 112, 122 are located on two sides of the processing tool 150 respectively. While the first load port 112 is located on the input side of the processing tool 150, the second load port 122 is located on the output side of the processing tool 150. As such, the first load port 112 and the second load port 122 form a pair, and the first lane changer 114 and the second lane changer 124 form a pair as well. In one embodiment, the first load port 112, the first lane changer 114, the processing tool 150, the second lane changer 124, the second load port 122 and the transport tool 190 are connected to each other, e.g. via a cable or bus line, such that they can communicate with each other to coordinate with respective operations. In one embodiment, the die carrier 142/146 is transported in FIG. 1 along the path 188.

Figure 2:
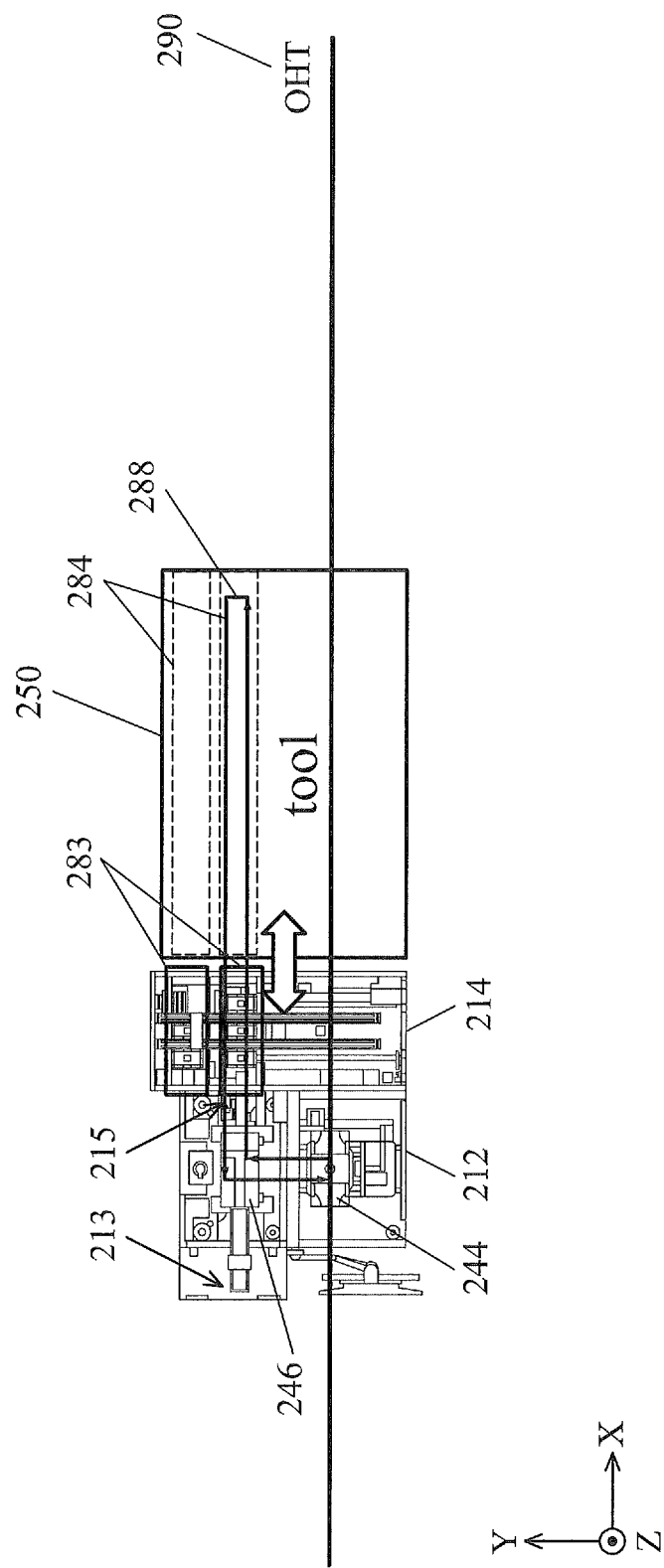
FIG. 2 illustrates another exemplary die processing system, in accordance with some embodiments of the present disclosure.

FIG. 2 illustrates a top view of another exemplary die processing system 200, in accordance with some embodiments of the present disclosure. As shown in FIG. 2, the die processing system 200 includes a load port 212, a lane changer 214, a processing tool 250 and a transport tool 290.

The transport tool 290 in this example may be an overhead hoist transport (OHT) that can transport a die carrier 244, e.g. a magazine holding several boats each including at least one die, between different processing tools during the IC manufacturing. The load port 212 in this example receives the die carrier 244 from the transport tool 290 and loads the die carrier 244 for the processing tool 250 to process at least one die in the die carrier 244.

The lane changer 214 in this example is coupled to the load port 212 and includes a plurality of lanes 283. The load port 212 may include a push bar 213 that is operable to push a boat from the received die carrier to a conveyor in the lane changer 214. The conveyor may move the boat along the Y direction and/or the Z direction to align the boat with an input of the processing tool 250. For example, when the processing tool 250 has a plurality of flowing channels 284, the conveyor of the lane changer 214 may move each boat to a corresponding lane aligned with one of the plurality of flowing channels 284, and convey the boat into the flowing channel of the processing tool 250 along the X direction to perform a corresponding processing on the dies in the boat.

As discussed above, in case the die carrier direction of the transport tool 290 is different from the desired direction of the push bar 213 and forms a certain angle, the die carrier 244 landed on the table of the load port 212 will be turned according to the certain angle before the boat in the die carrier 244 is pushed into the lane changer 214. A door of the turned die carrier 244 may be opened automatically, e.g. by an opening mechanism coupled to the load port 212, before a boat in the opened die carrier 246 is pushed by the push bar 213 into the lane changer 214, while the opened die carrier 246 extends along the X direction.

In this example, the same load port 212 also unloads a die carrier from the processing tool 250 after the pushed boat is processed. The conveyor of the lane changer 214 can move to a corresponding output of the processing tool 250 to receive a processed die boat. For example, when the processing tool 250 has a plurality of flowing channels 284, the conveyor of the lane changer 214 may move to a corresponding lane aligned with one of the plurality of flowing channels 284 that outputs the processed boat, and move the processed boat along the Y direction and/or the Z direction to a lane aligned with an additional push bar 215.

The additional push bar 215 in this example is operable to push a processed boat from the conveyor in the lane changer 214 to a die carrier stored at the load port 212, along the −X direction. The die carrier receiving the processed boat may be the die carrier 244 or may have a same type as that of the die carrier 244. In this example, the load port 212 also includes a closing mechanism that can automatically close a door onto the die carrier stored at the load port 212 to form a closed die carrier. In case the die carrier direction of the transport tool 290 and the desired direction of the additional push bar 215 form a certain angle, the closed die carrier will be turned by the turn stage on the table of the load port 212 according to the certain angle before the transport tool 290 picks up the turned die carrier from the table of the load port 212 and transports it to next processing tool for processing.

The processing tool 250 in this example performs one or more processing on the dies in each loaded boat, e.g. at the bumping die level, and outputs the processed boat via an output. In this example, the input and the output of the processing tool 250 are located on a same side (the side of where the lane changer 214 is located) of the processing tool 250. Accordingly, a single load port 212 is located on the input/output side of the processing tool 250. In one embodiment, the load port 212, the lane changer 214, the processing tool 250 and the transport tool 290 are connected to each other, e.g. via a cable or bus line, such that they can communicate with each other to coordinate with respective operations. In one embodiment, the die carrier 246 is transported in FIG. 2 along the path 288.

Figure 3:
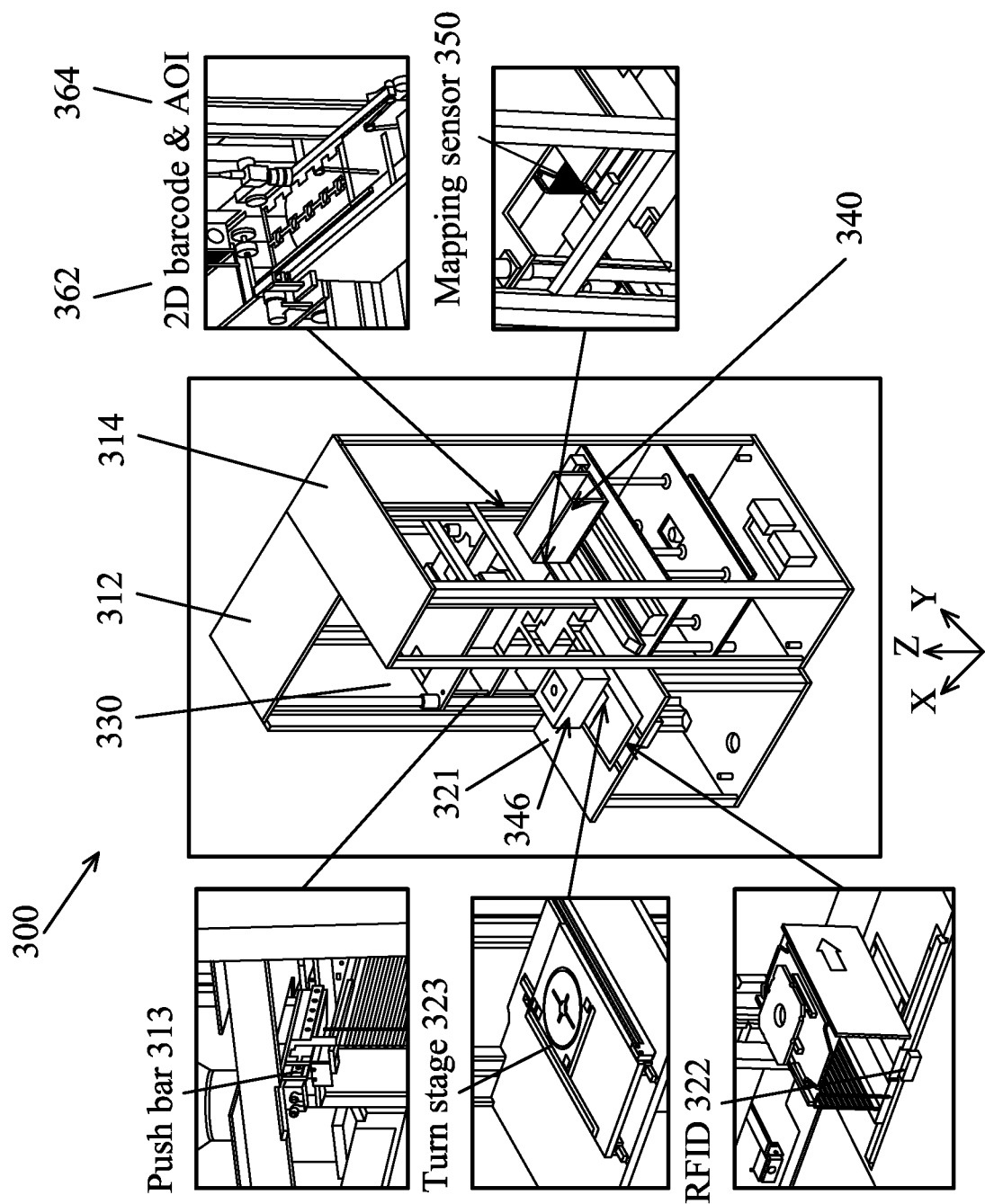
FIG. 3 illustrates a perspective view of an exemplary load port with a lane changer, in accordance with some embodiments of the present disclosure.

FIG. 3 illustrates a perspective view of an apparatus 300 including an exemplary load port 312 with a lane changer 314, in accordance with some embodiments of the present disclosure. As shown in FIG. 3, the load port 312 includes a table 321 that is configured to receive a die carrier 346, e.g. a magazine holding multiple boats each including one or more dies, from a transport tool, for processing at least one die in the die carrier 346 by a processing tool associated with the load port 312.

The load port 312 in this example also includes a turn stage 323 coupled on the table 321 and operable to turn the die carrier 346 when needed. In one embodiment, the die carrier 346 is transported by the transport tool in a first direction and placed onto the turn stage 323 on the table 321 by the transport tool. The turn stage 323 may turn the die carrier 346 from the first direction to a second direction for storing the die carrier 346 and/or retrieving a boat from the die carrier 346.

The load port 312 in this example also includes an identity (ID) reader 322, e.g. a radio frequency (RF) ID reader, that is coupled on the table 321 and operable to read information of the die carrier 346. For example, the ID reader 322 may read an RFID of the die carrier 346 to determine whether the die carrier 346 is correctly scheduled for processing by the processing tool.

The load port 312 in this example may include a storage space 330 configured to store a plurality of die carriers at a same time. For example, the storage space 330 may include multiple layers, e.g. 4 layers, where each layer can store a die carrier. The storage space 330 may include an elevator to transfer a die carrier from one layer to another.

While a die carrier is stored at the storage space 330, a push bar 313 of the load port 312 may push a boat including the at least one die from the die carrier 346 to the lane changer 314 for lane changing. In one embodiment, the turn stage 323 turns the die carrier 346 to the second direction to align with the carrier storage direction of the storage space 330. In another embodiment, the turn stage 323 turns the die carrier 346 to the second direction to align with the desired pushing direction of the push bar 313.

The lane changer 314 in this example is coupled to the load port 312 and comprises a conveyor 340 and a plurality of lanes. The push bar 313 of the load port 312 may push a boat from the die carrier 346 to the conveyor 340 in the lane changer 314. The conveyor 340 in this example is configured to move the boat along at least one direction, e.g. the Y direction and/or the Z direction in FIG. 3, to one of the plurality of lanes to align the boat with an input of the processing tool. In one embodiment, the processing tool is located at the −X direction of the lane changer 314. As such, the conveyor 340 conveys the boat into the processing tool along the −X direction in FIG. 3.

In one embodiment, a processing tool may include multiple chambers each of which corresponds to a different flowing channel. While the multiple flowing channels have different inputs, with different heights along the Z direction and/or different locations along the Y direction, the conveyor 340 of the lane changer 314 can move the boat to different lanes of the lane changer 314 by moving the boat along the Y direction and/or the Z direction to align the boat with a corresponding input of a flowing channel of the processing tool. Similarly, while different types of processing tools have different flowing channels with inputs at different heights along the Z direction and/or different locations along the Y direction, the conveyor 340 of the lane changer 314 can move the boat to different lanes of the lane changer 314 by moving the boat along the Y direction and/or the Z direction to align the boat with a corresponding input of a flowing channel of a corresponding processing tool. That is, the disclosed lane changer 314 may load a boat into inputs of various flowing channels of various types of processing tools, regardless where the inputs are located along the Y direction or Z direction.

In one embodiment, a mapping sensor 350 is coupled to the load port 312 or the lane changer 314 and configured to determine quantity information and/or location information of boats in the die carrier 346. In another embodiment, a barcode reader 362, e.g. a two-dimensional barcode reader, is coupled to the load port 312 or the lane changer 314 and is configured to identify and trace each boat that is processed by the processing tool. In yet another embodiment, an optional automated optical inspection (AOI) sensor 364 is coupled to the load port 312 or the lane changer 314 and is configured to determine quantity information and/or size information of dies on the boat to be pushed into the lane changer 314 for processing. In one example, the AOI sensor 364 may detect a defect on a surface of a die on the boat, and determine to bypass the boat without sending the boat for processing by the processing tool.

As discussed above, the conveyor 340 in one embodiment is further configured to receive the processed boat from an output of the processing tool after the at least one die is processed, and move the processed boat along the Y direction and/or the Z direction to align the processed boat with an additional push bar associated with the load port 312. The additional push bar is configured to push the processed boat from the conveyor 340 into the die carrier 346.

In one embodiment, the load port 312 also includes an opening mechanism configured to open a first door of the die carrier 346. The first door is then stored in a door storage of the load port 312. In one embodiment, the load port 312 is further configured to unload the die carrier 346 after the at least one die is processed. In this case, the load port 312 further comprises a closing mechanism configured to retrieve a second door having a same model as the first door from the door storage, and close the second door onto the die carrier 346 that has been unloaded.

Figure 4A:
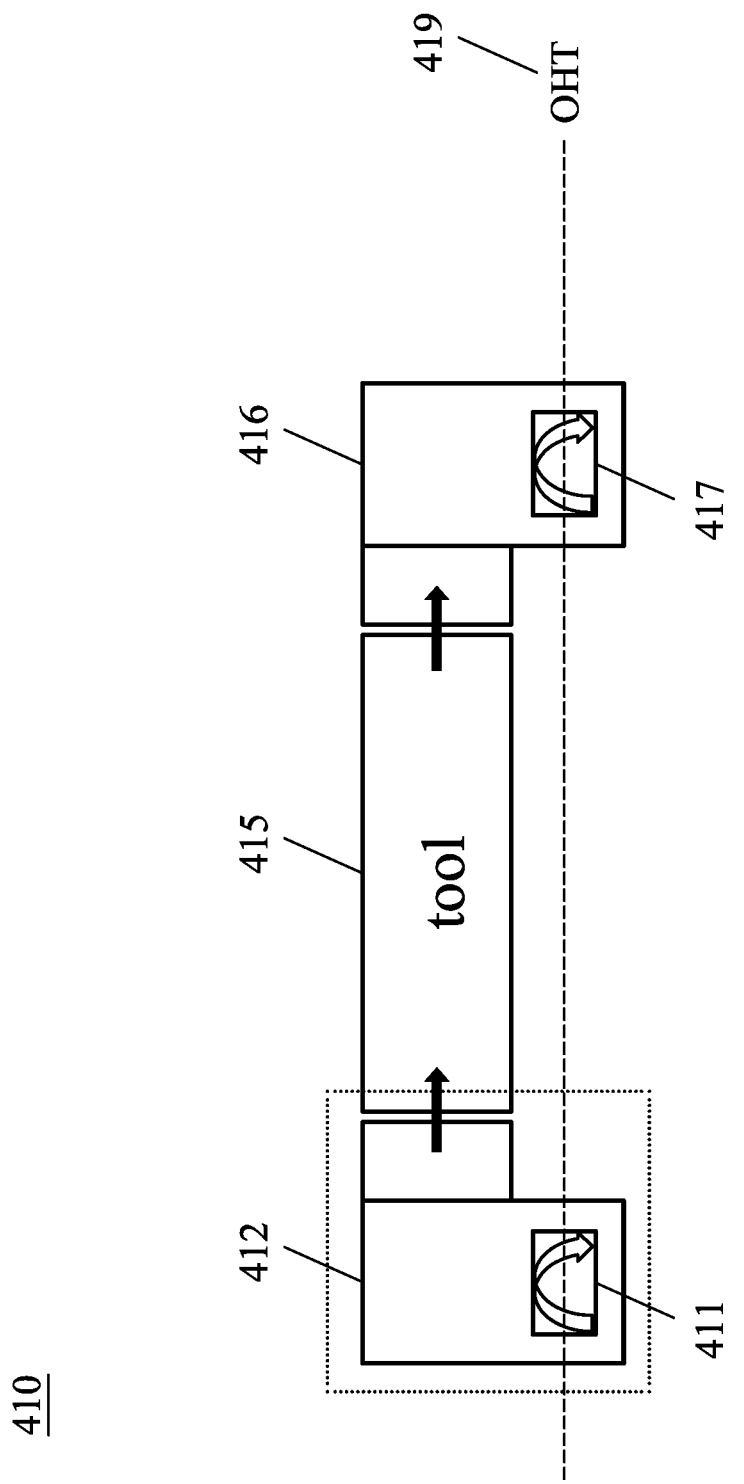
FIG. 4A illustrates a top view of an exemplary die processing system with a turn stage function, in accordance with some embodiments of the present disclosure.

FIG. 4A illustrates a top view of an exemplary die processing system 410 with a turn stage function, in accordance with some embodiments of the present disclosure. As shown in FIG. 4A, the die processing system 410 includes a processing tool 415 for processing dies. The dies are loaded into the processing tool 415 for processing by a load port 412 on one side of the processing tool 415, and unloaded from the processing tool 415 after processing by a load port 416 on an opposite side of the processing tool 415.

A transport tool 419 in this example may be an OHT that transports a die carrier 411 to the load port 412 for processing, and picks up a die carrier 417 from the load port 416 after processing. Each of the die carrier 411 and the die carrier 417 may be a magazine holding several boats each including at least one die. As discussed above, the transport tool 419 may place the die carrier 411 onto a table of the load port 412 along the Y direction, while the die carrier 411 needs to extend along the X direction for either storage or boat retrieving at the load port 412. As such, a turn stage on the table of the load port 412 turns the die carrier 411 to make the die carrier 411 extend along the X direction. Similarly, after the die processing at the processing tool 415, the die carrier 417 extends along the X direction when the die carrier 417 is first unloaded by the load port 416 to a table of the load port 416. Then a turn stage on the table of the load port 416 turns the die carrier 417 to make the die carrier 417 extend along the Y direction for the transport tool 419 to pick up.

In one embodiment, the direction of the die carrier held by the transport tool 419 and the desired direction of the die carrier for die carrier storage or boat retrieving are not perpendicular to each other, but form a certain angle. Then, the die carrier 411 landed on the table of the load port 412 will be turned according to the certain angle before the boat in the die carrier 411 is retrieved, e.g. pushed into a lane changer coupled to the load port 412. Accordingly, the die carrier 417 landed on the table of the load port 416 will be turned according to the certain angle before the die carrier 417 is picked up by the transport tool 419.

Figure 4B:
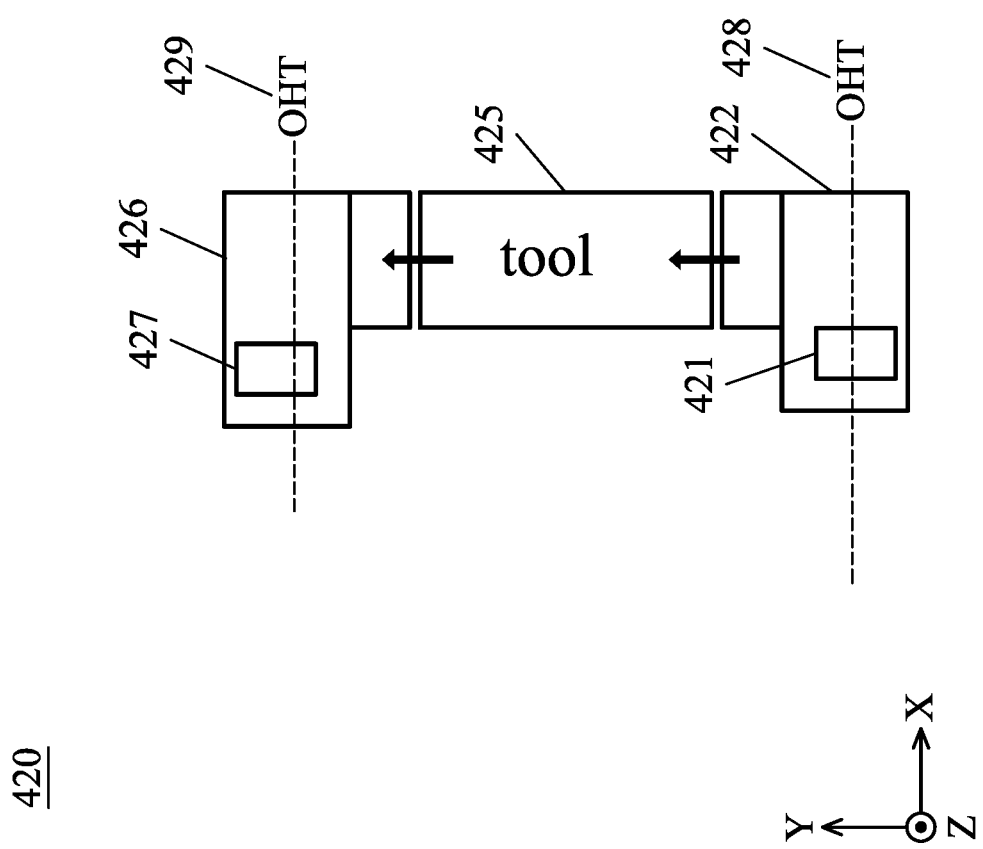
FIG. 4B illustrates a top view of another exemplary die processing system with a turn stage function, in accordance with some embodiments of the present disclosure.

FIG. 4B illustrates a top view of another exemplary die processing system 420 with a turn stage function, in accordance with some embodiments of the present disclosure. As shown in FIG. 4B, the die processing system 420 includes a processing tool 425 for processing dies. The dies are loaded into the processing tool 425 for processing by a load port 422 on one side of the processing tool 425, and unloaded from the processing tool 425 after processing by a load port 426 on an opposite side of the processing tool 425.

A transport tool 428 in this example may be an OHT that transports a die carrier 421 to the load port 422 for processing. A transport tool 429 in this example may be an OHT that picks up a die carrier 427 from the load port 426 after processing. Each of the die carrier 421 and the die carrier 427 may be a magazine holding several boats each including at least one die. In this example, the transport tool 428 may place the die carrier 421 onto a table of the load port 422 along the Y direction, which is the same direction as the desired direction of the die carrier 421 for either die carrier storage or boat retrieving at the load port 422. As such, the die carrier 421 landed on the table of the load port 422 need not and will not be turned before the boat in the die carrier 421 is retrieved, e.g. pushed into a lane changer coupled to the load port 422. Accordingly, the die carrier 427 landed on the table of the load port 426 need not and will not be turned before the die carrier 427 is picked up by the transport tool 429.

The die processing system 410 and the die processing system 420 may be located in a same FAB. That is, once the direction of a die carrier held by an OHT is fixed, the desired direction of the die carrier for die carrier storage or boat retrieving can be different for different layouts of different load ports. In addition, a load port direction and its desired die carrier direction may change due to, e.g. a movement of the associated processing tool, or reassigning the load port to another processing tool. The direction of a die carrier held by an OHT may also change in some scenario. As such, the die carrier needs to be turned in many cases before and/or after the die processing, e.g. by a turn stage disclosed herein.

Figure 5A:
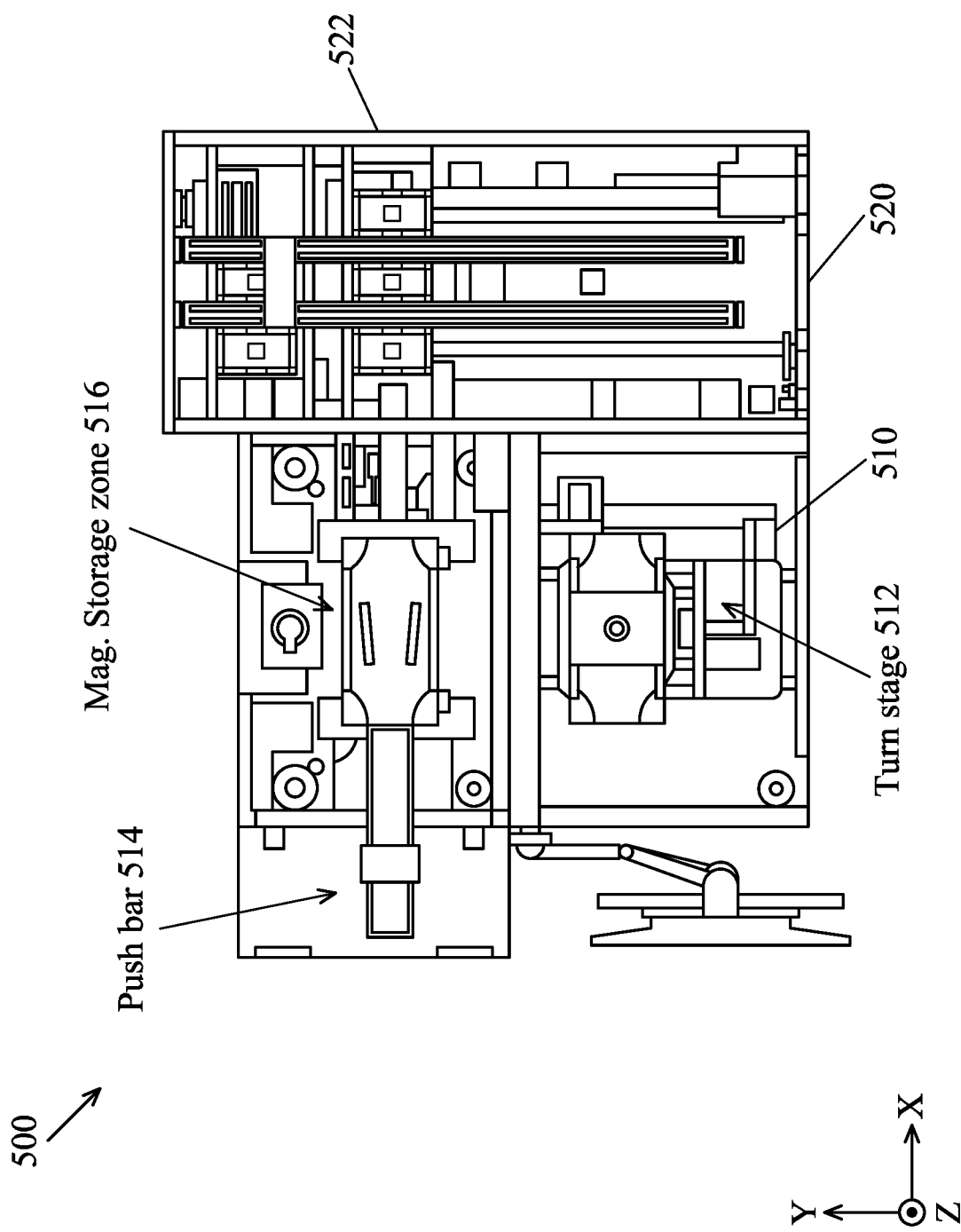
FIG. 5A illustrates a top view of an exemplary loading apparatus, in accordance with some embodiments of the present disclosure.

FIG. 5A illustrates a top view of an exemplary loading apparatus 500, in accordance with some embodiments of the present disclosure. As shown in FIG. 5A, the loading apparatus 500 includes a load port 510 and a lane changer 520 coupled to the load port 510. The load port 510 in this example loads a die carrier to a processing tool to process at least one die in the die carrier. The lane changer 520 in this example is coupled to the load port 510 and includes a plurality of lanes. The processing tool (not shown in FIG. 5A) in this example would be located to the X direction of the lane changer 520.

The load port 510 in this example may receive a die carrier, e.g. a magazine holding multiple boats each including at least one die, from a transport tool that lands the magazine onto a turn stage 512 on a table of the load port 510. As discussed above, the turn stage 512 may turn the magazine when needed due to a certain angle between the magazine holding direction of the transport tool and the desired magazine direction due to magazine storage or boat retrieving. The turned magazine is transferred to a magazine storage zone 516 of the load port 510. While the turned magazine is at the magazine storage zone 516, a push bar 514 of the load port 510 can push a boat from the magazine to a conveyor 522 in the lane changer 520. The conveyor 522 may move the boat along the Y direction and/or the Z direction to align the boat with an input of the processing tool, and convey the boat into the processing tool for die processing.

Figure 5B:
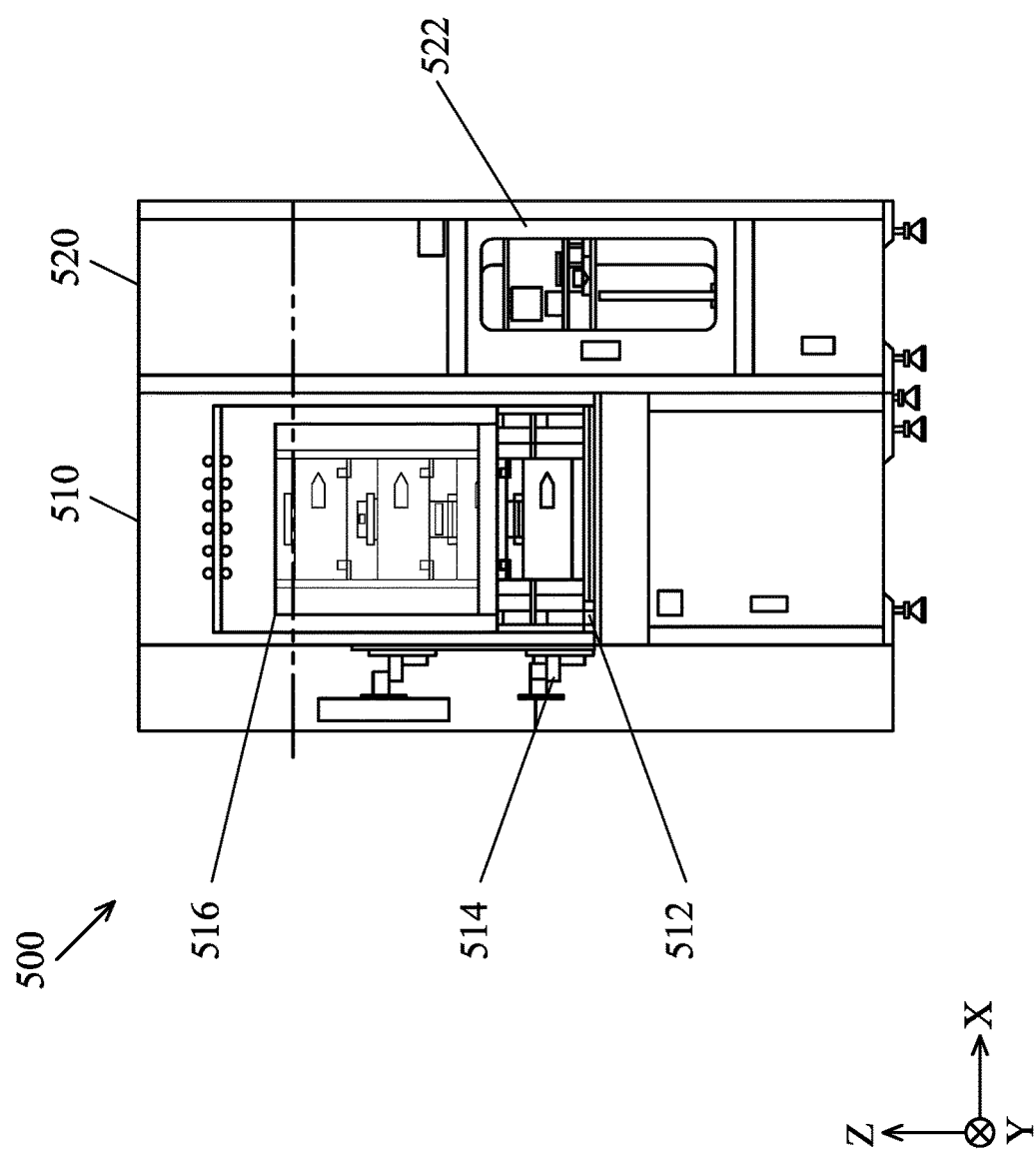
FIG. 5B illustrates a front view of the exemplary loading apparatus shown in FIG. 5A, in accordance with some embodiments of the present disclosure.

FIG. 5B illustrates a front view of the exemplary loading apparatus 500 shown in FIG. 5A, in accordance with some embodiments of the present disclosure. As shown in FIG. 5B, the magazine storage zone 516 can store multiple magazines at the same time. The push bar 514 is located to the −X direction of the magazine to be loaded for die processing. The push bar 514 pushes a boat from the magazine to the X direction onto the conveyor 522 of the lane changer 520 for conveying to a corresponding input of the processing tool.

Figure 5C:
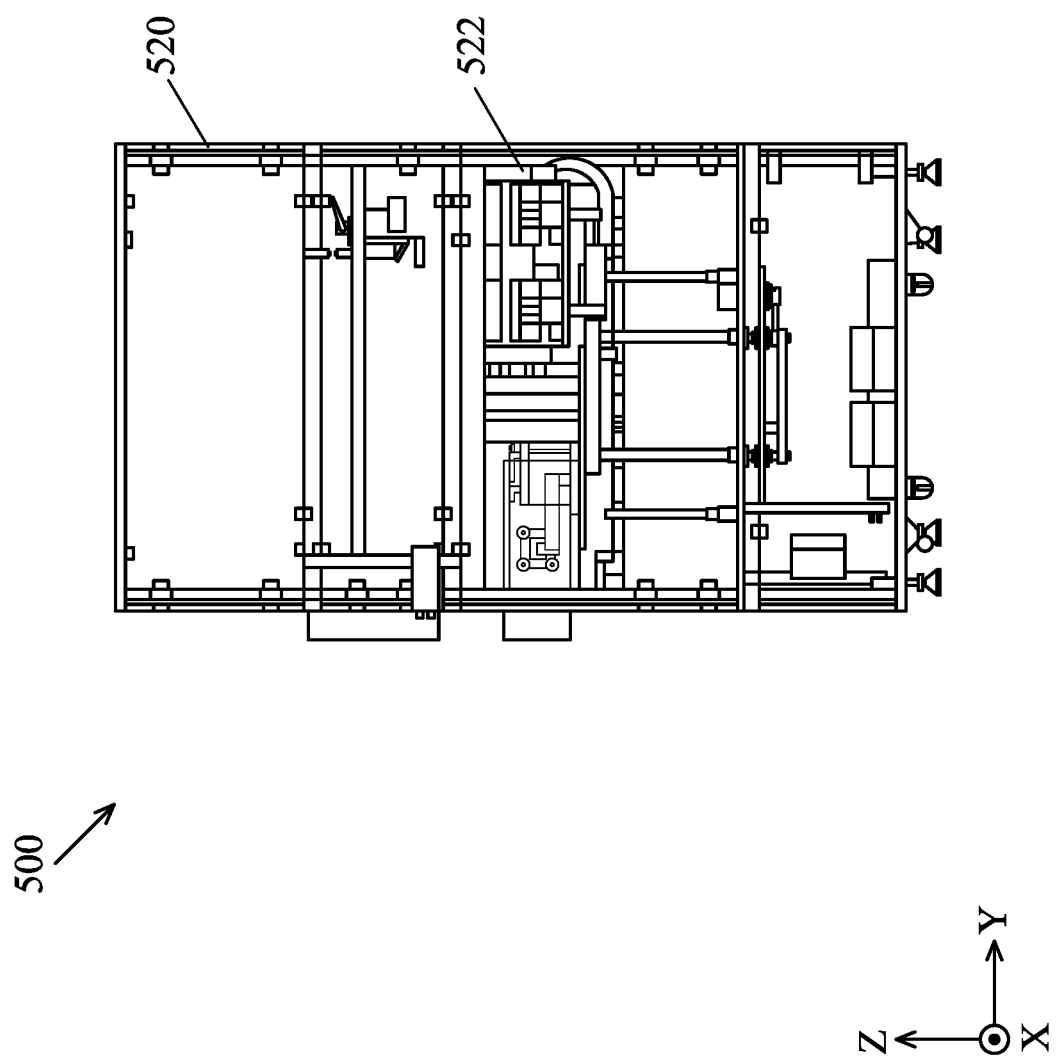
FIG. 5C illustrates a side view of the exemplary loading apparatus shown in FIG. 5A, in accordance with some embodiments of the present disclosure.

FIG. 5C illustrates a side view of the exemplary loading apparatus 500 shown in FIG. 5A, in accordance with some embodiments of the present disclosure. FIG. 5C shows a side view from the side of the lane changer 520. As shown in FIG. 5C, the conveyor 522 can move along the Y direction and the Z direction to fit different heights and locations of different processing tool inputs. In one embodiment, the lane changer 520 may include multiple conveyors that can convey multiple boats at the same time.

Figure 6:
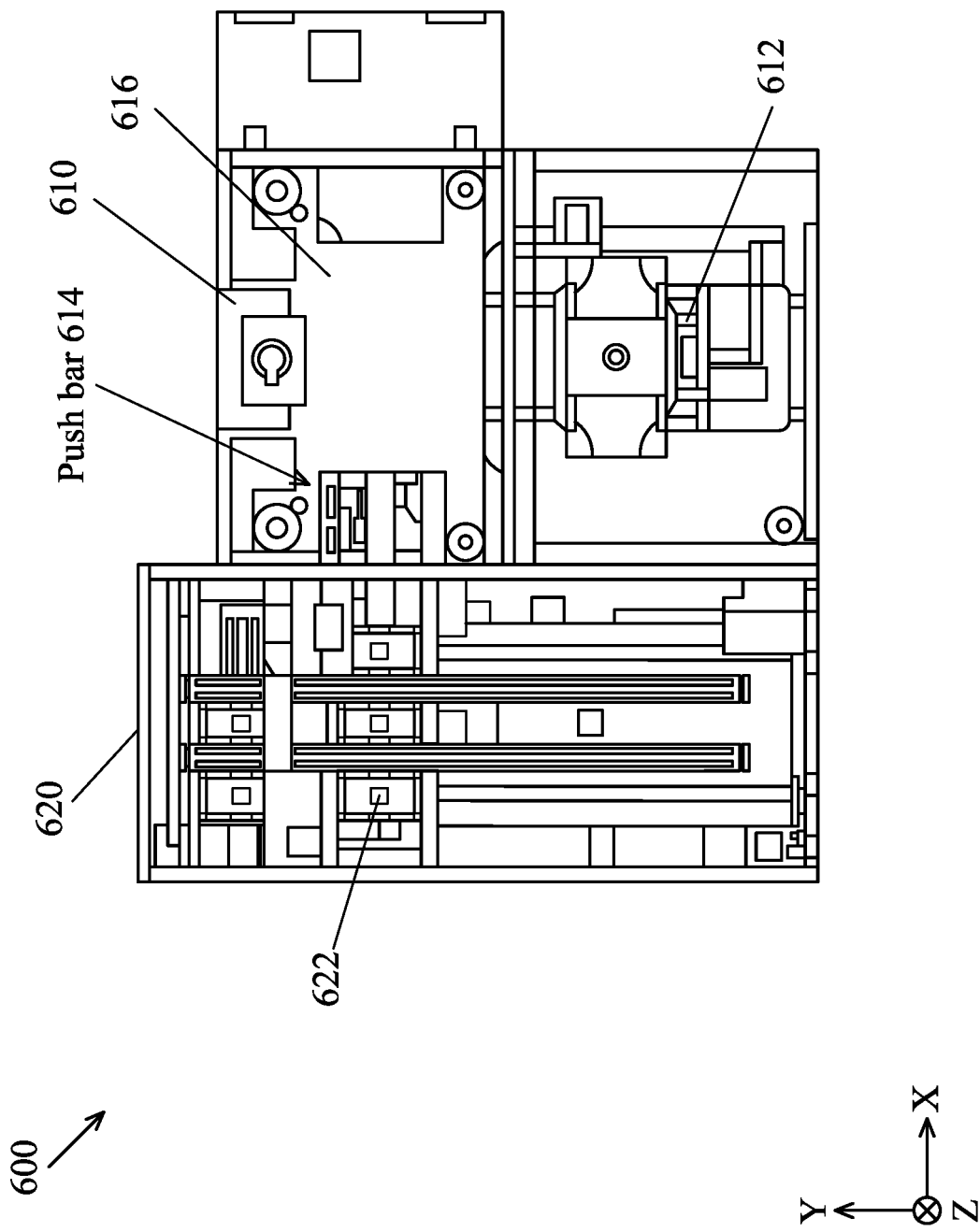
FIG. 6 illustrates a top view of an exemplary unloading apparatus, in accordance with some embodiments of the present disclosure.

FIG. 6 illustrates a top view of an exemplary unloading apparatus 600, in accordance with some embodiments of the present disclosure. The loading apparatus 500 shown in FIGS. 5A-5C is configured only for loading magazines for a processing tool. The unloading apparatus 600 in FIG. 6 is correspondingly configured only for unloading magazines from the processing tool. The processing tool (not shown in FIG. 6) in this example would be located to the −X direction of the unloading apparatus 600.

As shown in FIG. 6, the unloading apparatus 600 includes a load port 610 and a lane changer 620 coupled to the load port 610. The lane changer 620 in this example includes a plurality of lanes and receives a processed boat from the processing tool. The lane changer 620 may include a conveyor 622 that can move to a corresponding output of the processing tool to receive the processed die boat. For example, when the processing tool has a plurality of flowing channels, the conveyor 622 of the lane changer 620 may move to a corresponding lane aligned with one of the plurality of flowing channels that outputs the processed boat, and move the processed boat along the Y direction and/or the Z direction to a lane aligned with a push bar 614 coupled to the load port 610.

For example, when the conveyor 622 conveys the processed boat to an interface between the load port 610 and the lane changer 620, the push bar 614 in this example is operable to push the processed boat from the conveyor 622 to a magazine stored at a magazine storage zone 616 of the load port 610, along the X direction. The magazine receiving the processed boat may have a same type as that of the magazine loaded by the load port 510. In this example, a turn stage 612 on the table of the load port 610 may turn the unloaded magazine when needed due to a certain angle between the magazine holding direction of the transport tool and the desired magazine direction due to magazine storage or boat pushing. As such, the transport tool can pick up the turned magazine from the table of the load port 610 and transport the magazine to a next processing tool for processing.

In this example, the input and the output of the processing tool are located on different sides of the processing tool. While the loading apparatus 500 is located to the −X direction of the processing tool, the unloading apparatus 600 is located to the X direction of the processing tool. As such, the loading apparatus 500 and the unloading apparatus 600 form a pair. In one embodiment, the loading apparatus 500, the unloading apparatus 600 and the processing tool are connected to each other, e.g. via a cable or bus line, such that they can communicate with each other to coordinate with respective operations.

Figure 7A:
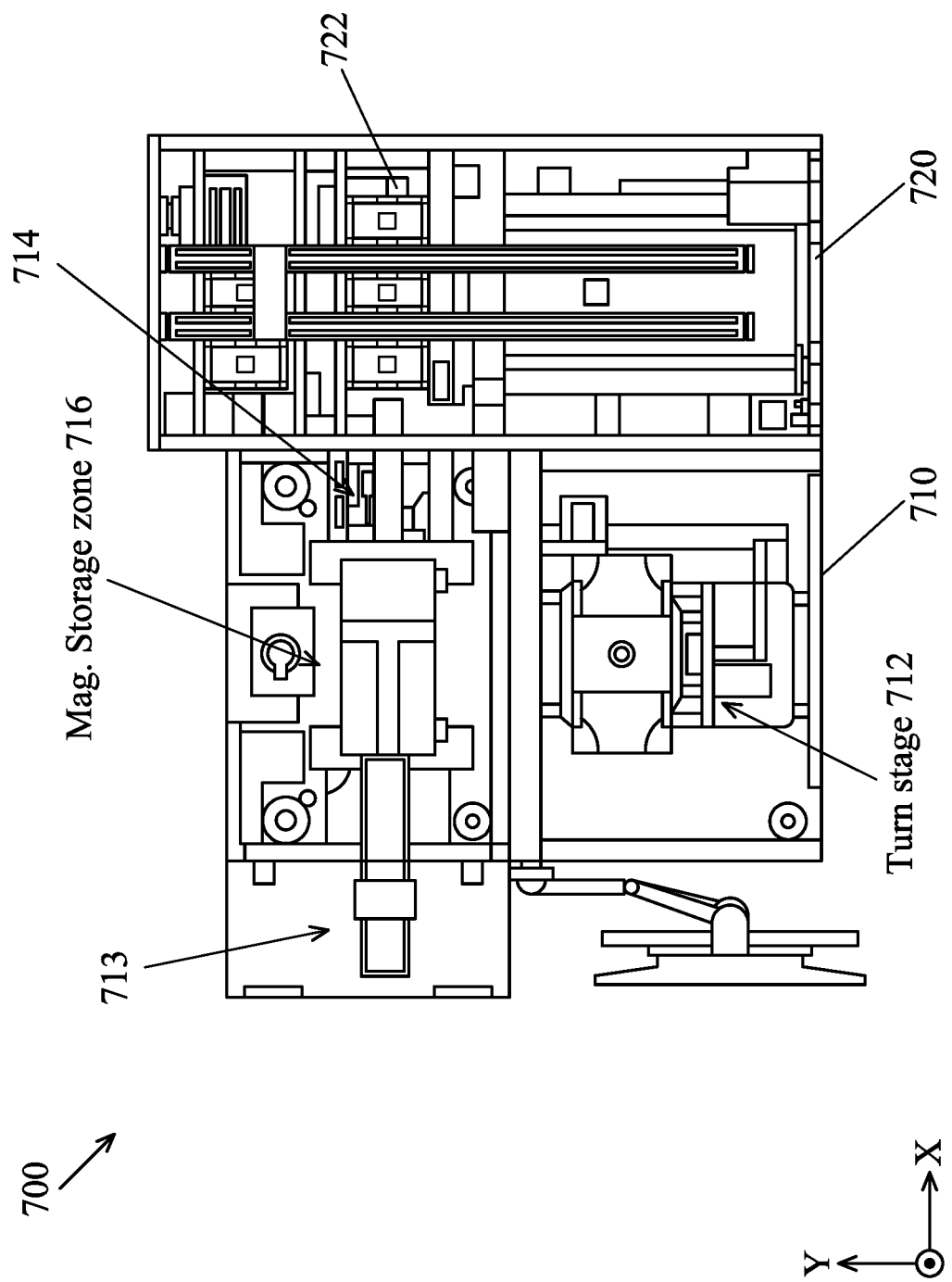
FIG. 7A illustrates a top view of another exemplary loading apparatus, in accordance with some embodiments of the present disclosure.

FIG. 7A illustrates a top view of another exemplary loading apparatus 700, in accordance with some embodiments of the present disclosure. As shown in FIG. 7A, the loading apparatus 700 includes a load port 710 and a lane changer 720 coupled to the load port 710. The load port 710 in this example loads a die carrier to a processing tool to process at least one die in the die carrier. The lane changer 720 in this example includes a plurality of lanes and conveys at least one die into the processing tool for processing. The processing tool (not shown in FIG. 7A) in this example would be located to the X direction of the lane changer 720.

The load port 710 in this example may receive a die carrier, e.g. a magazine holding multiple boats each including at least one die, from a transport tool that lands the magazine onto a turn stage 712 on a table of the load port 710. As discussed above, the turn stage 712 may turn the magazine when needed due to a certain angle between the magazine holding direction of the transport tool and the desired magazine direction due to magazine storage or boat retrieving. The turned magazine is transferred to a magazine storage zone 716 of the load port 710. While the turned magazine is at the magazine storage zone 716, a push bar 713 of the load port 710 can push a boat from the magazine to a conveyor 722 in the lane changer 720, along the X direction. The conveyor 722 may move the boat along the Y direction and/or the Z direction to align the boat with an input of the processing tool, and convey the boat into the processing tool for die processing.

In this example, the loading apparatus 700 is also an unloading apparatus configured for unloading magazines from the processing tool. The output and the input of the processing tool are located on a same side. After the die processing, the conveyor 722 can move to a corresponding output of the processing tool to receive the processed die boat, and conveys the processed boat to an interface between the load port 710 and the lane changer 720. An additional push bar 714 in this example is coupled to the load port 710 and is operable to push the processed boat from the conveyor 722 to a magazine stored at the magazine storage zone 716 of the load port 710, along the –X direction. The magazine receiving the processed boat may be the same as the magazine loaded by the load port 710, or may have a same type as that of the magazine loaded by the load port 710. In this example, the turn stage 712 on the table of the load port 710 may turn the unloaded magazine when needed due to a certain angle between the magazine holding direction of the transport tool and the desired magazine direction due to magazine storage or boat pushing. Then the transport tool can pick up the turned magazine from the table of the load port 710 and transport the magazine to a next processing tool for processing. In one embodiment, the loading apparatus 700 and the processing tool are connected to each other, e.g. via a cable or bus line, such that they can communicate with each other to coordinate with respective operations.

Figure 7B:
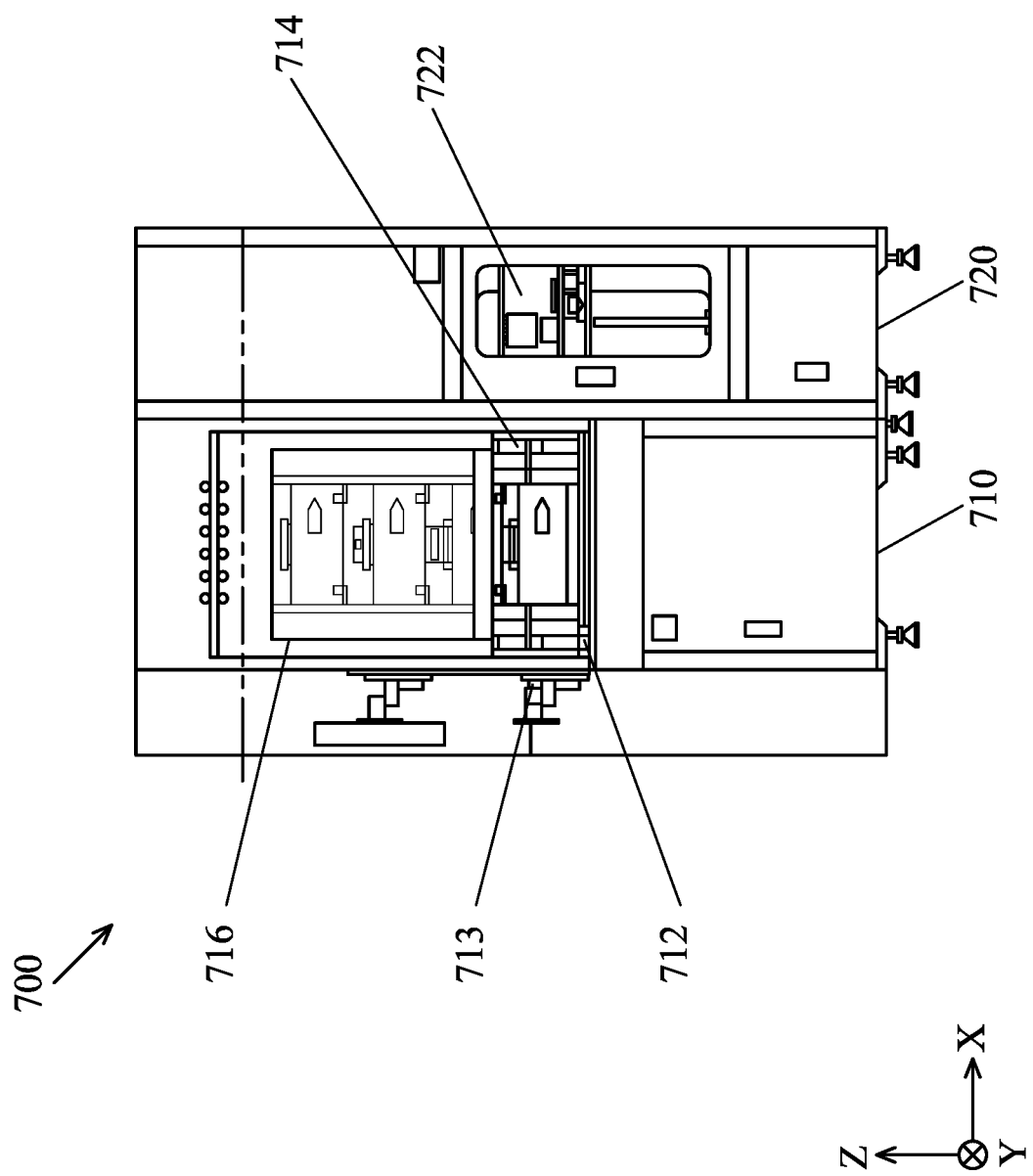
FIG. 7B illustrates a front view of the exemplary loading apparatus shown in FIG. 7A, in accordance with some embodiments of the present disclosure.

FIG. 7B illustrates a front view of the exemplary loading apparatus 700 shown in FIG. 7A, in accordance with some embodiments of the present disclosure. As shown in FIG. 7B, the magazine storage zone 716 can store multiple magazines at the same time. The push bar 713 is located to the –X direction of a magazine to be loaded for die processing; while the additional push bar 714 is located to the X direction of a magazine to be unloaded after die processing.

Figure 7C:
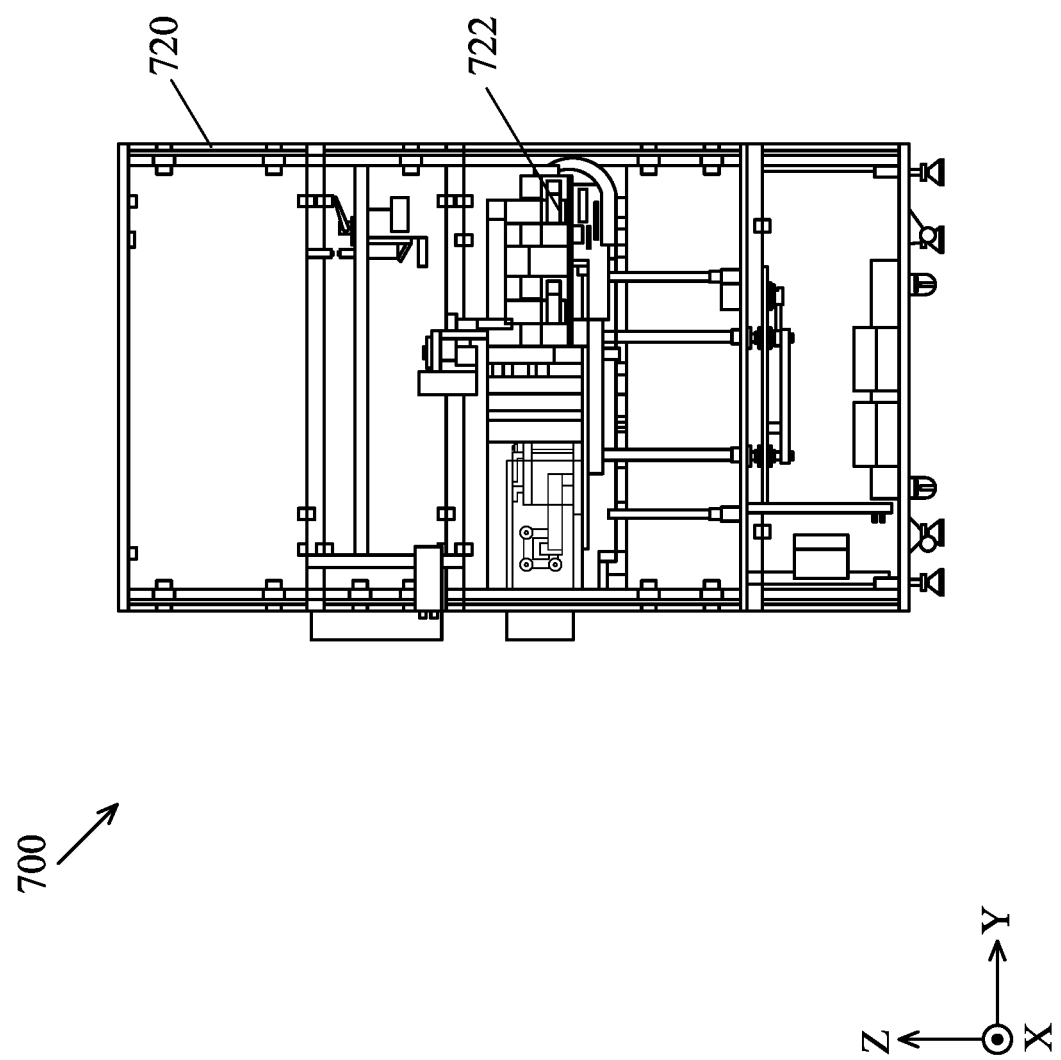
FIG. 7C illustrates a side view of the exemplary loading apparatus shown in FIG. 7A, in accordance with some embodiments of the present disclosure.

FIG. 7C illustrates a side view of the exemplary loading apparatus 700 shown in FIG. 7A, in accordance with some embodiments of the present disclosure. FIG. 7C shows a side view from the side of the lane changer 720. As shown in FIG. 7C, the conveyor 722 can move along the Y direction and the Z direction to fit different heights and locations of different processing tool inputs. In one embodiment, the lane changer 720 may include multiple conveyors that can convey multiple boats at the same time.

FIG. 8 is a flow chart illustrating an exemplary method 800 for handling die carriers, in accordance with some embodiments of the present disclosure. As shown in FIG. 8, a die carrier is received at operation 802 in a first direction. The die carrier is operable to hold a plurality of dies. At operation 804, the die carrier is turned from the first direction to a second direction, e.g. for storing the die carrier and/or retrieving a boat from the die carrier. At least one die is retrieved at operation 806 from the die carrier. The at least one die is loaded at operation 808 into a processing tool for processing the at least one die.

Figure 9:
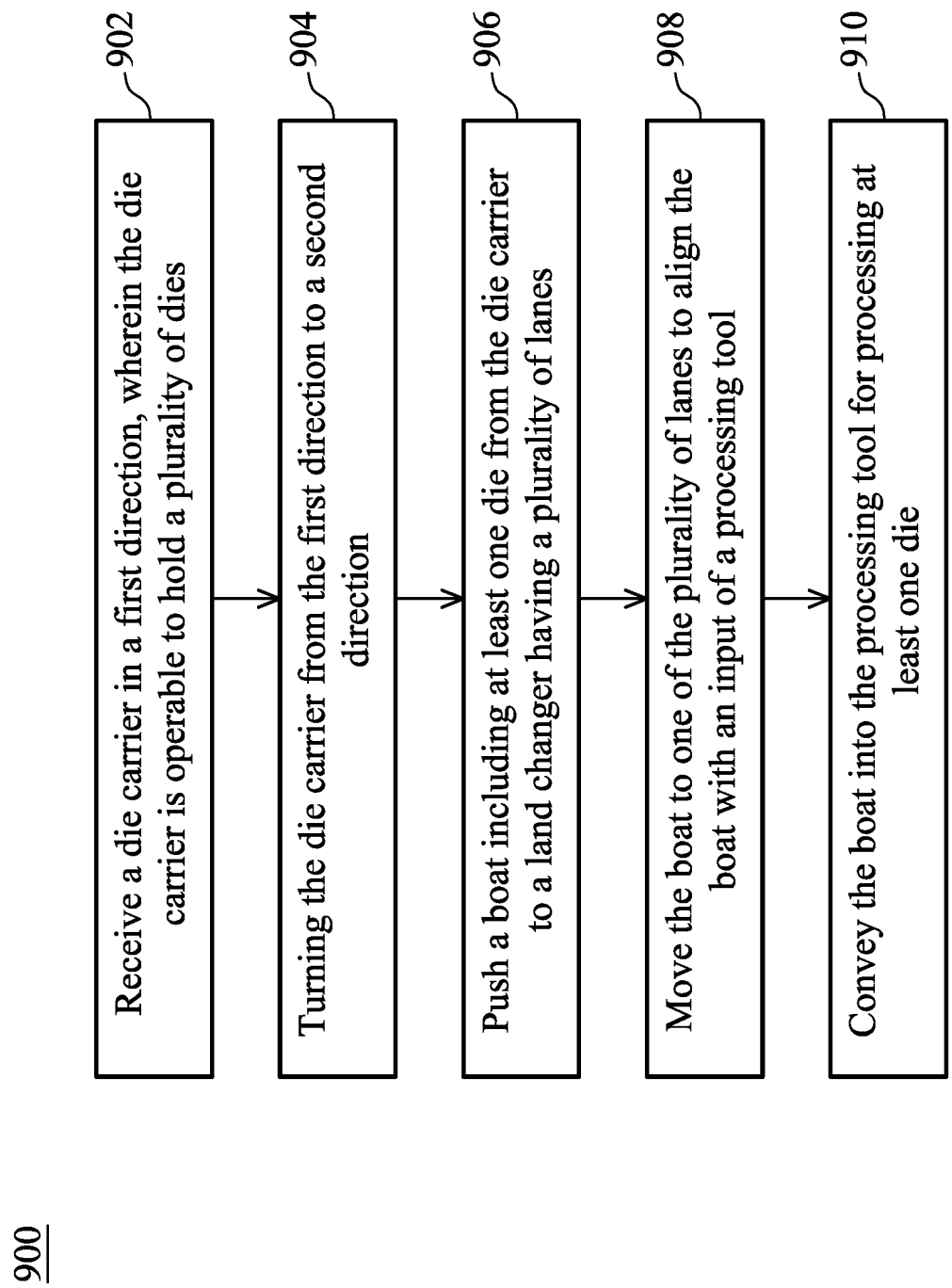
FIG. 9 is a flow chart illustrating another exemplary method for handling die carriers, in accordance with some embodiments of the present disclosure.

FIG. 9 is a flow chart illustrating another exemplary method 900 for handling die carriers, in accordance with some embodiments of the present disclosure. As shown in FIG. 9, a die carrier is received at operation 902 in a first direction. The die carrier is operable to hold a plurality of dies. At operation 904, the die carrier is turned from the first direction to a second direction, e.g. for storing the die carrier and/or retrieving a boat from the die carrier. A boat including at least one die is pushed at operation 906 from the die carrier to a lane changer having a plurality of lanes. At operation 908, the boat is moved to one of the plurality of lanes to align the boat with an input of a processing tool. The boat is conveyed at operation 910 into the processing tool for processing the at least one die. It can be understood that the order of the steps shown in each of FIG. 8 and FIG. 9 may be changed according to different embodiments of the present disclosure.

In an embodiment, an apparatus for handling die carriers is disclosed. The apparatus includes: a load port configured to load a die carrier operable to hold a plurality of dies into a processing tool; and a lane changer coupled to the load port and configured to move at least one die in the die carrier to an input of the processing tool and transfer the at least one die into the processing tool for processing the at least one die.

In another embodiment, an apparatus for handling die carriers is disclosed. The apparatus includes: a table configured to receive a die carrier in a first direction, wherein the die carrier is operable to hold a plurality of dies; a turn stage coupled on the table and operable to turn the die carrier from the first direction to a second direction for retrieving at least one die from the die carrier for processing by a processing tool; and a storage space configured to store a plurality of die carriers at a same time.

In yet another embodiment, a method for handling die carriers is disclosed. The method includes: receiving a die carrier in a first direction, wherein the die carrier is operable to hold a plurality of dies; turning the die carrier from the first direction to a second direction; retrieving at least one die from the die carrier; and loading the at least one die into a processing tool for processing the at least one die.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for handling die carriers, comprising:
a load port configured to load dies in a die carrier into a processing chamber, wherein the die carrier is operable to hold a plurality of boats each carrying a plurality of dies; and
a lane changer comprising a plurality of lanes located beside the load port, coupled to the load port and configured to move at least one boat in the die carrier to an input of the processing chamber and transfer the at least one boat into the processing chamber for processing dies carried by the at least one boat,
wherein the load port comprises:
a table configured to receive the die carrier from an overhead hoist transport (OHT); and
a radio frequency identity (RFID) reader coupled on the table and operable to read information of the die carrier to determine whether the die carrier is correctly scheduled for processing by the processing chamber.

2. The apparatus of claim 1, wherein the load port comprises a storage space configured to store a plurality of die carriers at a same time.

3. The apparatus of claim 1, wherein:
the die carrier is transported onto the table by the OHT in a first direction.

4. The apparatus of claim 3, wherein:
the load port comprises a turn stage coupled on the table and operable to turn the die carrier from the first direction to a second direction for storing the die carrier.

5. The apparatus of claim 4, wherein the die carrier is placed onto the turn stage on the table by the OHT.

6. The apparatus of claim 1, wherein:
the load port comprises a push bar operable to push a boat from the die carrier to the lane changer; and
the lane changer is configured to move the boat along at least one direction to one of the plurality of lanes to align the boat with the input of the processing chamber and convey the boat into the processing chamber.

7. The apparatus of claim 6, further comprising a mapping sensor configured to determine at least one of quantity information or location information of boats in the die carrier.

8. The apparatus of claim 6, further comprising a two-dimensional barcode reader configured to identify and trace the boat that is processed by the processing chamber.

9. The apparatus of claim 6, wherein:
the lane changer is further configured to receive the boat from an output of the processing chamber after the dies on the boat are processed, and move along at least one direction to align the boat with an additional push bar associated with the load port; and
the additional push bar is configured to push the boat back into the die carrier.

10. The apparatus of claim 1, further comprising:
an automated optical inspection (AOI) sensor coupled to the load port or the lane changer, and configured to detect a defect on at least one of the dies in the die carrier, wherein the AOI sensor is further configured to determine at least one of quantity information or size information of the dies in the die carrier.

11. The apparatus of claim 1, wherein the load port is configured to open a first door of the die carrier and store the first door in a predetermined location.

12. The apparatus of claim 11, wherein:
the load port is further configured to unload the die carrier after the dies on the at least one boat are processed; and
the load port is further configured to retrieve a second door having a same model as the first door, and close the second door onto the die carrier that has been unloaded.

13. The apparatus of claim 1, further comprising:
an additional load port configured to unload the die carrier after the dies on the at least one boat are processed; and
an additional lane changer coupled to the additional load port and configured to transfer the at least one boat from an output of the processing chamber into the die carrier with an additional push bar associated with the additional load port.

14. An apparatus for handling die carriers, comprising:
a load port; and
a lane changer comprising a plurality of lanes located beside the load port and coupled to the load port,
wherein the load port comprises:
a table configured to receive a die carrier in a first direction, wherein the die carrier is operable to hold a plurality of boats each carrying a plurality of dies,
a turn stage coupled on the table and operable to turn the die carrier from the first direction to a second direction for the lane changer to retrieve at least one boat from the die carrier for processing the dies carried by the at least one boat in a processing chamber, and
a radio frequency identity (RFID) reader coupled on the table and operable to read information of the die carrier to determine whether the die carrier is correctly scheduled for processing by the processing chamber.

15. The apparatus of claim 14, wherein:
the load port further comprises a push bar operable to push a boat from the die carrier to the lane changer, wherein the lane changer is configured to move the boat to one of the plurality of lanes to align the boat with an input of the processing chamber and convey the boat into the processing chamber for processing the dies on the boat.

16. The apparatus of claim 15, further comprising:
a two-dimensional barcode reader configured to identify and trace the boat that is processed by the processing chamber.

17. The apparatus of claim 14, further comprising:
a mapping sensor configured to determine at least one of quantity information or location information of boats in the die carrier.

18. A method for handling die carriers, comprising:
receiving a die carrier in a first direction, wherein the die carrier is operable to hold a plurality of boats each carrying a plurality of dies;
turning the die carrier from the first direction to a second direction;
retrieving multiple boats from the die carrier;

conveying the multiple boats at the same time to align the multiple boats with different inputs of a processing chamber, respectively; and loading the multiple boats into different flowing channels of the processing chamber via the different inputs, respectively, for processing the dies carried by the multiple boats in the processing chamber.

19. The method of claim 18, wherein retrieving the multiple boats comprises:

pushing each of the multiple boats from the die carrier to a lane changer having a plurality of lanes.

20. The method of claim 19, further comprising:

receiving, via a respective one of the plurality of lanes of the lane changer, each of the multiple boats from a respective output of the processing chamber after dies on the boat are processed; and pushing each of the multiple boats back into the die carrier.

\* \* \* \* \*